(12) United States Patent
Johnson (10) Patent No.: US 6,246,264 B1
(45) Date of Patent: Jun. 12, 2001

(54) CIRCUIT FOR GENERATING OUTPUT SIGNALS AS A FUNCTION OF INPUT SIGNALS

(75) Inventor: Bret Johnson, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/408,689

(22) Filed: Sep. 30, 1999

(30) Foreign Application Priority Data

Sep. 30, 1998 (DE) .............................................. 198 44 936

(51) Int. Cl.⁷ .......................... H03K 19/003; H03K 19/02
(52) U.S. Cl. .................... 326/93; 326/57; 326/28
(58) Field of Search ............................ 326/56–58, 26–28, 326/83, 93–95

(56) References Cited

U.S. PATENT DOCUMENTS

| 5,379,325 | * | 1/1995 | Katayama et al. ..................... 375/106 |
| 5,598,112 | * | 1/1997 | Phillips ................................ 326/93 |
| 5,646,553 | * | 7/1997 | Mitchell et al. ...................... 326/86 |
| 5,731,715 | * | 3/1998 | Mote, Jr. .............................. 326/93 |
| 6,028,448 | * | 2/2000 | Landry ................................. 326/58 |

FOREIGN PATENT DOCUMENTS

| 2 127 944 | | 12/1972 | (DE) . | |
| 43 24 138 A1 | * | 1/1994 | (DE) .................................. | 326/58 |
| 44 34 803 C1 | | 3/1996 | (DE) . | |
| 196 25 185 A1 | | 1/1997 | (DE) . | |
| 196 34 181 A1 | | 8/1997 | (DE) . | |
| 1 452 999 | | 10/1976 | (GB) . | |

* cited by examiner

Primary Examiner—Michael Tokar
Assistant Examiner—James H Cho
(74) Attorney, Agent, or Firm—Herbert L. Lerner; Laurence A. Greenberg; Werner H. Stemer

(57) ABSTRACT

An output driver circuit of a clocked integrated semiconductor memory of the DRAM type is driven by a circuit for generating an output signal as a function of two input signals. A validity signal, which is supplied to the circuit, ensures that the data to be output are in a valid state before the output driver is activated. As a result, a situation in which different propagation times of input signals of the output driver circuit lead to multiple switching operations within an access cycle of a memory access is prevented. An event-oriented control of the enabling process of the output driver ensures a proper function even in the case of variable frequencies of the clock control.

13 Claims, 10 Drawing Sheets

CIRCUIT FOR GENERATING OUTPUT SIGNALS AS A FUNCTION OF INPUT SIGNALS

BACKGROUND OF THE INVENTION

Field of the Invention

The invention relates to a circuit for generating output signals as a function of input signals. The circuit serves as a part of a driver configuration for an output driver and ensures that data are output at an instant when they are regarded as valid.

Output drivers of various types occupy a central function as a component part of integrated semiconductor circuits. As a result of higher clock and data rates in integrated semiconductor circuits, the requirements with regard to the switching speed and a reliable voltage supply are also increasing. The high current pulses at output drivers and at the voltage supply, that are produced in connection with high clock rates and that lead to potential fluctuations in oscillatory systems, can in some instances cause malfunctions in other circuit sections of a semiconductor memory. Oscillatory systems are produced for example by line inductances of leads, bonding wires or lead frames in conjunction with capacitances on the chip.

Problems can arise, in particular, if the signal which enables an output driver and a datum to be applied to the output driver have different propagation times. This problem is present primarily in the case of clocked high-speed memory modules in which the memory access is triggered asynchronously with respect to the clock signal which enables the output driver. If the output driver is enabled too early, there is the risk that the datum to be output is not yet valid and changes its state during the enabled state of the driver. In such a case, a corresponding switching transistor of the output driver switches twice in direct succession, which, at high clock rates even of single switching operations, leads to even higher rates of current rise or in other words steeper current rises. Added to this is the fact that the output driver does not switch from the highimpedance state in the case of the second switching operation, rather at least one switching transistor is already in the on state in other words in the conducting state. In the event of a state change, this switching transistor must be put into the off state as rapidly as possible, which engenders additional current pulses which amplify the abovementioned effect. The disturbances and irregularities produced in this way result in potential fluctuations at the terminals of the output driver or of the supply voltage which are significantly higher than in the case of a normal, single switching operation.

Attempts have previously been made to limit the rates of current rise which are caused by switching operations of output drivers, and likewise to reduce the inductances on the chip in terms of their magnitude. However, the technical possibilities are limited in this context. In earlier DRAM architectures, in particular fast-page-mode DRAMs and extended-data-out DRAMs with fixed access cycles, a validity signal is generated which enables the output driver only when valid data are present. It is thus ensured that only a single switching operation of the output driver takes place. What this presupposes is a certain memory access time which elapses starting from the triggering of the data access and by which the enabling of the output driver is delayed. In the case of higher and variable frequencies of the access cycle, however, there is the risk that the signal which disables the output driver after a data access and the memory access time overlap temporally, which thus leads to a defective functioning of the output driver. In the case of modern DRAMs (dynamic random access memories), in particular SDRAMs (synchronous DRAMs) and other forms of clocked DRAMs, a temporal overlap of the memory access time and of a clock signal which enables the output driver and disables it again is possible in a certain range. Therefore, a simple control of the data access which stipulates the access cycle and thus the activation of the output driver in terms of instant and duration is no longer appropriate, without there being the risk of multiple switching operations during an access cycle.

SUMMARY OF THE INVENTION

It is accordingly an object of the invention to provide a circuit for generating output signals as a function of input signals which overcomes the above-mentioned disadvantages of the heretofore-known circuits of this general type and in particular it is an object to provide a circuit configuration which is suitable for driving an output driver of a clocked DRAM-type semiconductor memory in the course of a memory access, so that a reliable operation is possible in the case of a variable clock frequency.

With the foregoing and other objects in view there is provided, in accordance with the invention, a circuit for generating output signals as a function of input signals, including:

a first terminal for receiving a first input signal and a second terminal for receiving a second input signal, each of the first and second input signals having an active state and an inactive state;

a first output, connected to the first terminal, for supplying a first output signal having an active state and an inactive state and being derived from the first and second input signals;

a second output, connected to the first terminal, for supplying a second output signal having an active state and an inactive state;

a first storage device having a first input connected to the second terminal for receiving the second input signal and having an output, connected to the first output, for supplying an output signal having an active state and an inactive state, the storage device being configured such that the output signal of the output of the first storage device has an active state as soon as an active signal is present at the first input of the storage device, such that, in the event of the output signal of the first storage device being in the active state, the first output signal is switched from the inactive state to the active state at a first instant in the event of a last occurring transition selected from the group consisting of a transition of the first input signal from the inactive state to the active state and a transition of the second input signal from the inactive state to the active state, when the first input signal is in the active state, and such that the second output signal is switched from the inactive state to the active state at a second instant in the event of a transition of the first input signal from the inactive state to the active state.

In accordance with another feature of the invention, the first storage device is configured such that the first output signal is switched from the active state to the inactive state in the event of a transition of the first input signal from the active state to the inactive state immediately following the first instant.

In accordance with yet another feature of the invention, the first storage device is configured such that the first output signal is switched from the active state to the inactive state in the event a transition of the first input signal from the active state to the inactive state immediately following the first instant or in the event of a transition of the second input signal from the active state to the inactive state depending on which transition occurs last.

In accordance with a further feature of the invention, the first storage device is configured such that the first output signal and/or the second output signal remains in the active state during a fixed time period and subsequently changes to the inactive state.

In accordance with yet a further feature of the invention, the first storage device is configured such that the fixed time period is at least as long as is required by components, to be connected to the first output, to reliably identify a transition of the first output signal between the active state and the inactive state.

In accordance with another feature of the invention, the first storage device is configured such that the second output signal is switched from the active state to the inactive state in the event of a transition of the first input signal from the active to the inactive state immediately following the second instant or in the event of a transition of the second input signal from the active state to the inactive state, depending on which transition occurs last.

In accordance with yet another feature of the invention, the first storage device is configured such the fixed time period, calculated from an instant starting when the second input signal changes to the active state, is at least as long as is required by components, to be connected to the second output, to reliably identify a transition of the second output signal between the active state and the inactive state.

In accordance with an added feature of the invention, the first storage device has a second input, and the circuit includes a second storage device having a first input connected to the first terminal for receiving the first input signal, and having a second input and an output; a first inverter having an input connected to the second terminal for receiving the second input signal and having an output connected to the second input of the second storage device; a delay circuit having an input connected to the output of the second storage device and having an output; a second inverter having an input connected to the first terminal for receiving the first input signal and having an output; a first logic combination circuit having a first input connected to the output of the second inverter, a second input connected to the output of the delay circuit, and an output connected to the second input of the first storage device; and a second logic combination circuit having a first input connected to the first terminal for receiving the first input signal, a second input connected to the output of the first storage device, and an output connected to the first output for providing the first output signal.

In accordance with another feature of the invention, the first storage device has a second input, and the circuit includes a first logic combination circuit having a first input connected to the first terminal for receiving the first input signal, a second input connected to the output of the first storage device and having an output; a first inverter having an input connected to the second terminal for receiving the second input signal and having an output; a third storage device having a first input connected to the output of the first logic combination circuit, having a second input connected to the output of the first inverter, and having an output connected to the first output for supplying the first output signal; a second inverter having an input connected to the first input terminal for receiving the first input signal and having an output; a second logic combination circuit having a first input connected to the output of the second inverter, having a second input, and an output connected to the second input of the first storage device; and a delay circuit having an input connected to the output of the third storage device and an output connected to the second input of the second logic combination circuit for receiving the first output signal from the third storage device and for supplying the first output signal time delayed to the second combination circuit, the second logic combination circuit logically combining the time delayed first output signal with an inverted first input signal.

In accordance with yet another feature of the invention, the first storage device has a second input and the circuit includes a first inverter having an input connected to the second terminal for receiving the second input signal and having an output; a second inverter having an input connected to the first terminal for receiving the first input signal and having an output; a first logic combination circuit having a first input connected to the output of the second inverter for receiving an inverted first input signal, having a second input, and an output connected to the second input of the first storage device; a second storage device having a first input connected to the first terminal for receiving the first input signal, a second input connected to the output of the first inverter for receiving an inverted second input signal, and having an output having an active state and an inactive state; a first delay circuit having an input connected to the output of the second storage device and having an output; a second logic combination circuit having a first input connected to the first terminal for receiving the first input signal, a second input connected to the output of the first storage device, and having an output; a third storage device having a first input connected to the output of the second logic combination circuit, a second input, and having an output connected to the first output for supplying the first output signal; and a second delay circuit having an input connected to the output of the third storage device and having an output connected to the second input of the third storage device for supplying the first output signal time delayed to the third storage device.

In accordance with another feature of the invention, the first storage device has a second input, and the circuit includes a first logic combination circuit having a first input connected to the first terminal for receiving the first input signal, a second input connected to the second terminal for receiving the second input signal, and having an output; an inverter having an input connected to the second terminal for receiving the second input signal and having an output; a fourth storage device having a first input connected to the output of the first logic combination circuit, a second input connected to the output of the inverter for receiving an inverted second input signal, and having an output having an active state and an inactive state; and a second logic combination circuit having a first input connected to the first terminal for receiving the first input signal, a second input connected to the output of the fourth storage device, and having an output connected to the second output for supplying the second output signal.

In accordance with a further feature of the invention, the first storage device has a second input, and the circuit includes a first logic combination circuit having a first input connected to the first terminal for receiving the first input signal, a second input connected to the second terminal for receiving the second input signal, and having an output; a second logic combination circuit having a first input connected to the first terminal for receiving the first input signal, a second input, and an output connected to the second output for supplying the second output signal; a fourth storage device having a first input connected to the output of the first logic combination circuit, a second input, and having an output having an active state and an inactive state connected to the second input of the second logic combination circuit; and a delay circuit having an input connected to the output of the fourth storage device and having an output connected to the second input of the second storage device.

The circuit according to the invention serves as a part of a driver configuration for an output driver and ensures that data are output at a time from which on they are regarded as valid.

In accordance with the invention, given a buffer-stored validity signal, the output driver is activated by an edge of a clock signal at comparatively small and medium clock frequencies and by an edge of the validity signal at comparatively high and very high clock frequencies. According to embodiments of the invention, a sufficient pulse duration of the enable signal for the output driver is ensured and a circuit for a similar sequence control for a second enable signal as well as variants of the circuits are specified.

Other features which are considered as characteristic for the invention are set forth in the appended claims.

Although the invention is illustrated and described herein as embodied in a circuit for generating an output signal as a function of two input signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
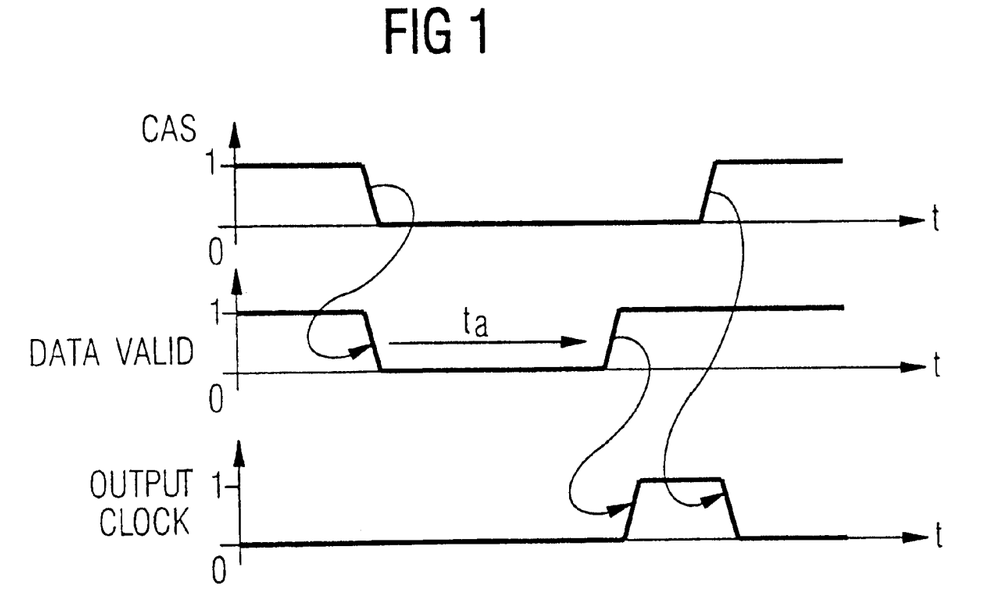
FIG. 1 is a signal diagram of a temporal course of control signals of a fast-page-mode-type DRAM during a memory access.

Referring now to the figures of the drawings in detail and first, particularly, to FIG. 1 thereof, there is shown a temporal course of control signals of an integrated semiconductor memory of the fast-page-mode-type DRAM in the course of a memory access. To that end, the address of the relevant memory cell is applied externally, which is not illustrated in FIG. 1. Through the use of a signal CAS, the address is read into the memory and the corresponding memory cell is addressed. In order to prevent the data transfer from beginning before the data at the input of the output driver circuit have assumed their final state, a validity signal "data valid" is generated, which indicates the validity of the data to be output. It is switched to be active when the data are valid, and inactive at the earliest when the access has been finished. The situation in which an applied datum changes its state during the enabling of the output driver and thus, possibly, triggers a double switching operation is prevented as a result of this. The time which elapses from the addressing of the memory cell through the use of the signal CAS and the presence of valid data is the so-called memory access time ta.

FIG. 1 shows how, after the application of an "active low", that is to say active in the state "log 0", signal CAS, and after the memory access time ta has elapsed, the validity signal "data valid" is switched to be active and, in turn, activates a signal "output clock" for enabling the output driver. The signals "data valid" and "output clock" are in this case "active high", that is to say active in the state "log 1". The enabling of the output driver is ended with the transition of the signal CAS from the active to the inactive state; the signal "output clock" becomes inactive. In this example, the signal CAS is repeated at regular intervals; the access cycle thus has a uniform frequency. In the case of higher or variable frequencies of the access cycle, however, there is the risk that the memory access time ta and the next transition of the signal CAS from the active state to the inactive state overlap temporally, with the result that the signal "output clock" is not activated and the output driver is not cleared. For applications with variable frequencies of the memory access, the method outlined is thus only suitable for a limited frequency range.

FIGS. 2 to 6 show a time sequence of control signals of a clocked integrated semiconductor memory of the SDRAM type in the course of a memory access. In this case, the clock signal "clock" has a variable frequency. A plurality of frequency ranges of the clock signal "clock" and the different effects on the signal "output clock" for enabling the output driver are illustrated. In order to take account of variable frequencies during the memory access, the validity signal "data valid" is pulsed. The clock signal "clock" is active high. A data access is triggered by a transition of the clock signal "clock" from the inactive to the active state, similarly to the signal CAS from FIG. 1. The validity signal "data valid", which is likewise active high, is switched to be active after the memory access time ta has elapsed.

Figure 2:
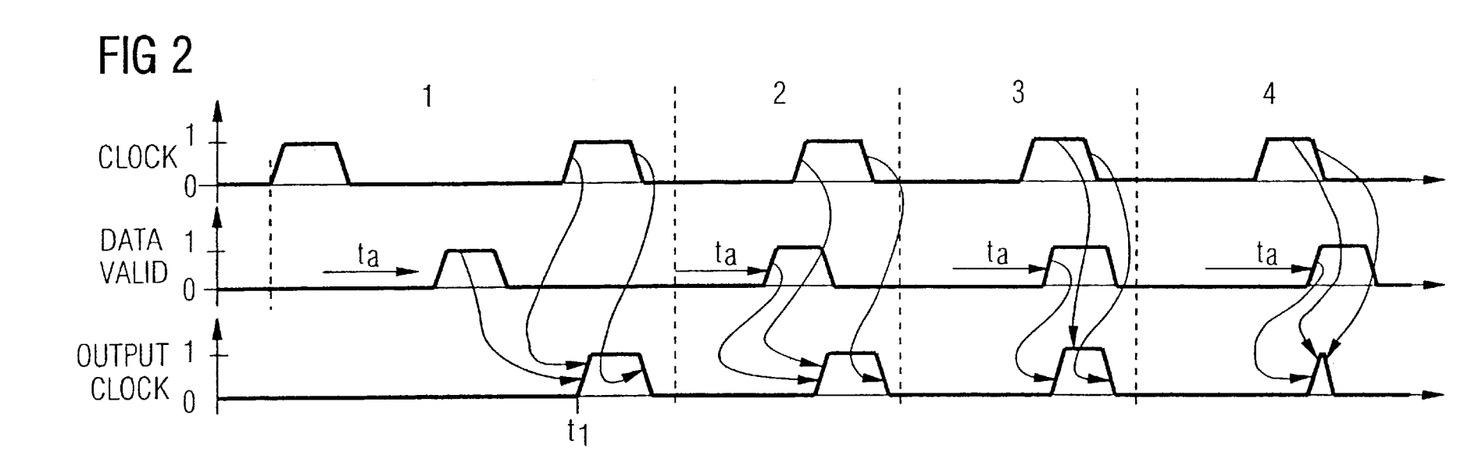
FIGS. 2 to 6 are signal diagrams of a temporal course of control signals of a clocked integrated semiconductor memory of the SDRAM type during a memory access.

In the frequency ranges 1 and 2 as illustrated in FIG. 2, which represent comparatively small and medium frequencies of the clock signal "clock", the validity signal "data valid" is temporarily stored or buffer-stored. When an active buffer-stored validity signal "data valid" is present, the next transition of the clock signal "clock" from the inactive to the active state switches the signal "output clock", for enabling the output driver (also see FIG. 7), to the active state (active high) at a first instant t1. In the frequency ranges 3 and 4 according to FIG. 2, which represent comparatively high and very high frequencies of the clock signal "clock", the signal "output clock" is not switched to be active by an edge of the clock signal "clock", but rather, during the active clock signal "clock", by the edge of the validity signal "data valid" from the inactive to the active state. Ultimately, the first instant t1 of the switching operation is determined by that edge of the signal clock or data valid which occurs last chronologically. The signal "output clock" is switched to be inactive in the event of a transition of the clock signal "clock" from the active to the inactive state which immediately follows the first instant t1. In principle, the outlined functionality of the output driver circuit and thus of the memory access is ensured only if the active states of the signals "clock" and "data valid" overlap temporally. The functionality of the output driver may be jeopardized, therefore, at very high frequencies (frequency range 4). Since the active states of the signals "clock" and "data valid" hardly overlap at all, the pulse of the signal "output clock" becomes very short in temporal terms, which may mean that components connected downstream (also cf. FIG. 7) no longer detect this pulse. In other words, in such a case, the output driver is not enabled and remains in the high-impedance state.

Figure 3:
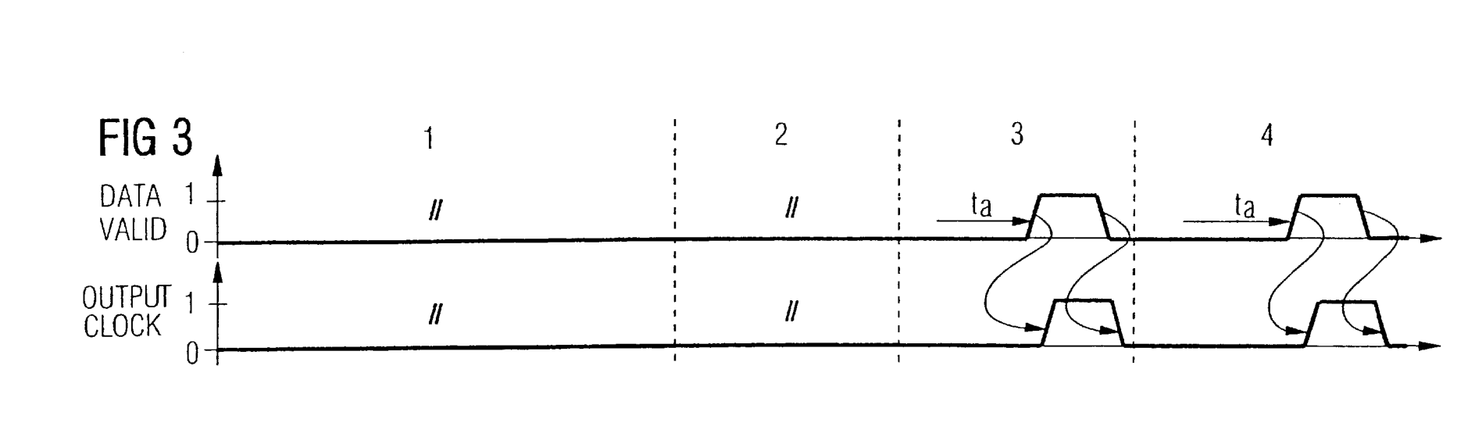

As is illustrated in FIG. 3, the signal "output clock" is not switched to be inactive exclusively by an edge of the clock signal "clock", but switches from the active state to the inactive state in the event of a transition of the clock signal "clock" from the active to the inactive state which immediately follows the first instant t1, or in the event of the transition of the validity signal "data valid" from the active state to the inactive state, depending on which transition occurs last. It is thus ensured that the pulse duration of the active signal "output clock" lasts long enough to trigger an enabling process of the output driver.

Figure 4:
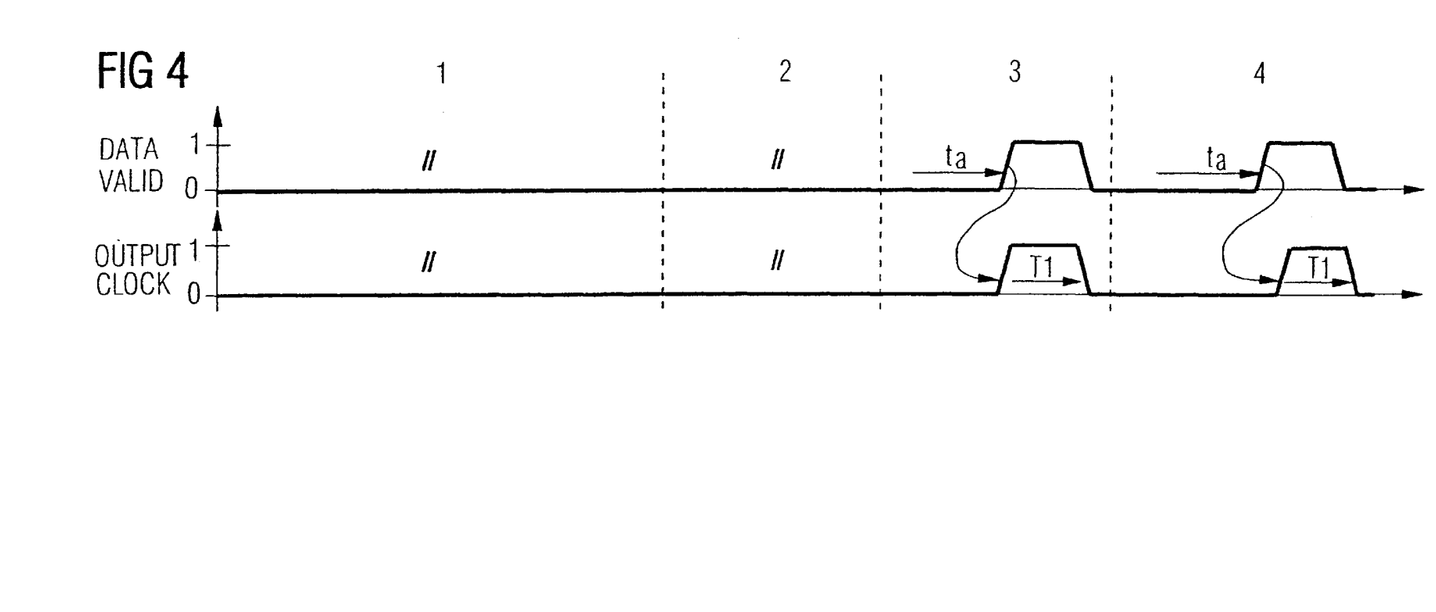

As shown in the frequency ranges 3 and 4 in FIG. 4, this can also be ensured in a further variant. There, the signal "output clock" remains in the active state during a first fixed time period T1 and subsequently changes to the inactive state. In this case, the first fixed time period T1 should be at least as long as required by the components connected to the terminal for the signal "output clock" for reliable signal identification in the event of a state change of the signal "output clock" (also see FIG. 7). It is expedient here to choose a time period which corresponds to the time in which the clock signal "clock" is in the active state, as illustrated in FIG. 4.

Figure 5:
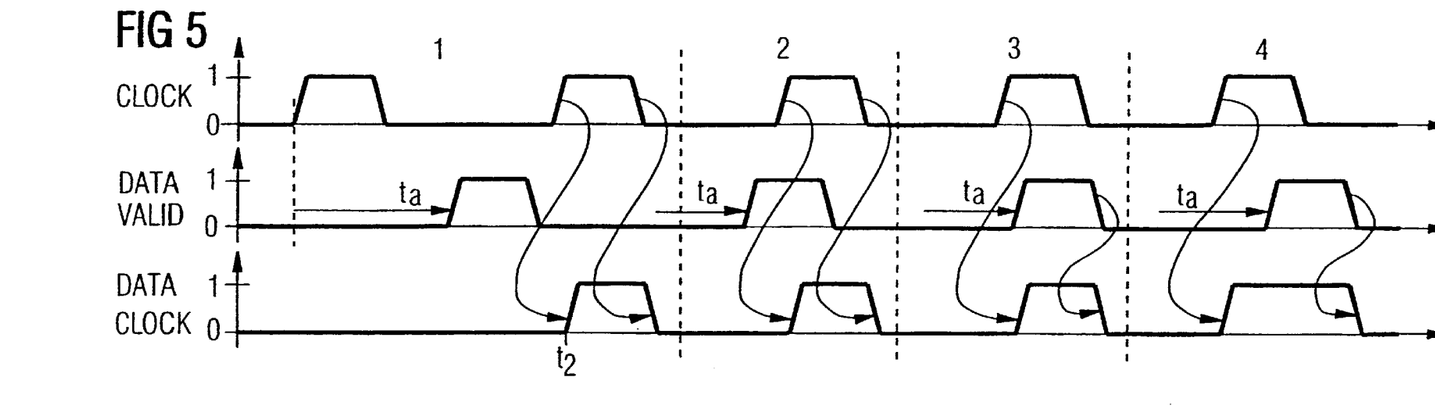
Figure 6:
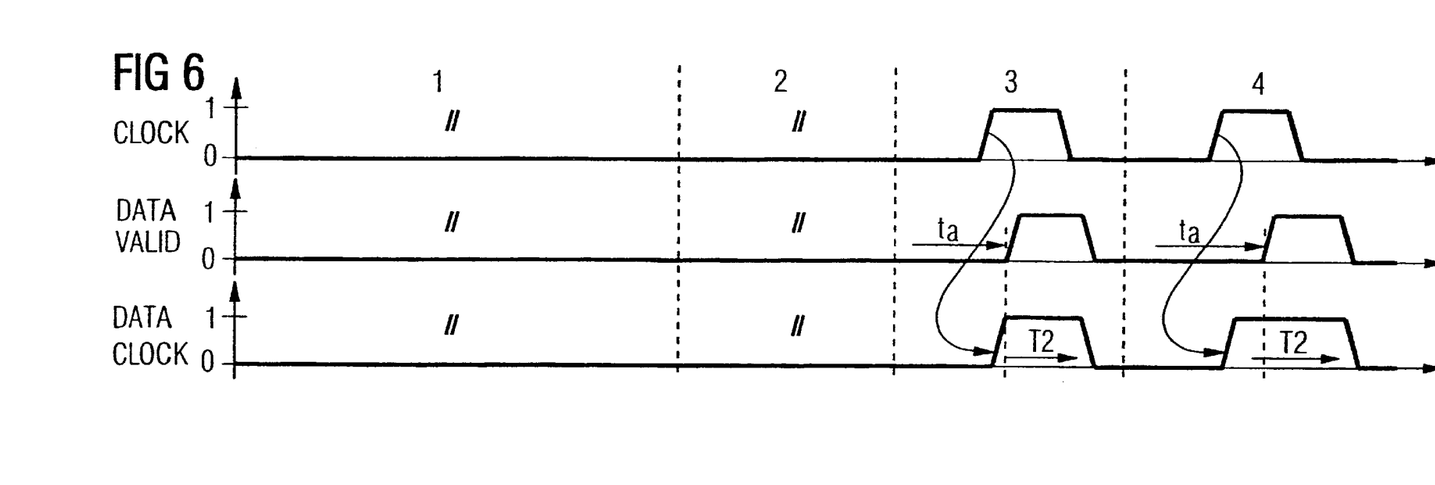
Figure 7:
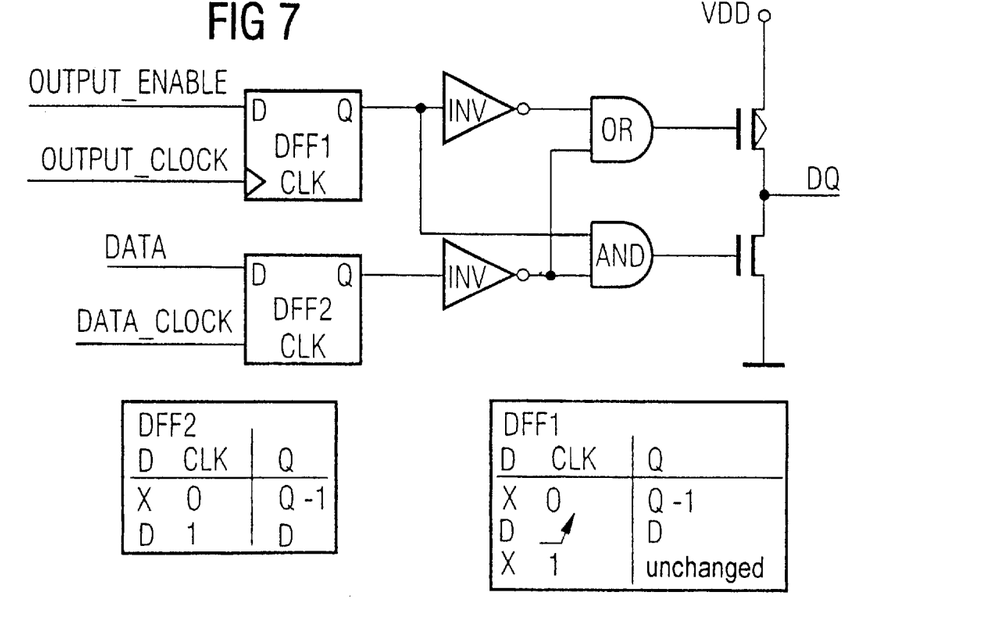
FIG. 7 includes a schematic block diagram of an exemplary output driver of a clocked integrated semiconductor memory of the SDRAM type and includes tables illustrating the control of the output driver using the control signals according to FIGS. 2 to 6.

In FIGS. 5 and 6, the signal "data clock" (active high) is generated in a similar manner to the signal "output clock" for enabling the output driver, and serves for enabling a data driver which applies to the output driver the data to be output (also see FIG. 7). Accordingly, the signal "data clock" is switched from the inactive to the active state at a second instant t2 in the event of a transition of the clock signal "clock" from the inactive state to the active state. It is not necessary in this case to let the signal "data clock" switch only when the signal data valid is active. Under the control of the signal "output clock", the output driver is not enabled before the active signal "data valid" and is thus in the high-impedance state, as a result of which changes at the data input of the output driver have no effect. Thus the structure of the circuit can be simplified.

According to FIG. 5, the signal "data clock" is switched from the active state to the inactive state in the event of a transition of the clock signal "clock" from the active to the inactive state which immediately follows the second instant t2, or in the event of the transition of the validity signal "data valid" from the active state to the inactive state, depending on which transition occurs last chronologically. Just as in the case of the signal "output clock", the intention here is to ensure the functionality of the driver circuit through the use of an appropriate pulse duration of the signal "data clock".

FIG. 6 illustrates another possibility in this respect. The signal "data clock" remains in the active state during a second fixed time period T2 and subsequently changes to the inactive state. In this case, too, the second fixed time period T2, calculated from the instant starting when the validity signal "data valid" changes to the active state, should be at least as long as required by the components, connected to the terminal for the signal "data clock", to reliably identify a signal in the event of a state change of the signal "data clock". It is expedient here to choose a time period which corresponds to the time in which the clock signal "clock" is in the active state, as is illustrated in FIG. 6.

FIG. 7 illustrates an exemplary output driver of a clock-pulse controlled integrated semiconductor memory of the SDRAM type with an exemplary driving using the control signals "output clock" and "data clock" according to FIGS. 2 to 6. In addition to the input signals "output clock" and "data clock", the signal "output enable" and the signal "data" are present as input signals. The signal "output enable" is made available by the controller of the memory as a superordinate enable signal for the driving. The signal "data" contains the data of the addressed memory cell that are to be read. Depending on the above-mentioned input signals, an output signal DQ of the output driver is generated which corresponds to the data of the addressed memory cell that are to be read. The components and the function of the output driver of FIG. 7 are shown using customary component symbols and tables and need not be explained in further detail.

Figure 8:
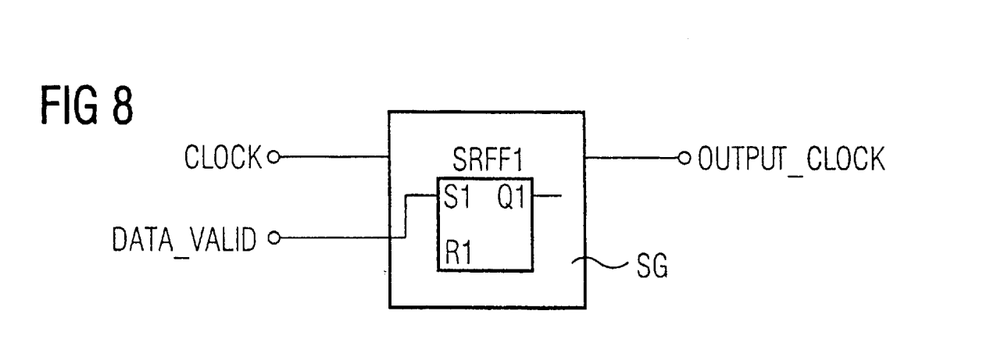
FIGS. 8 and 9 are schematic block diagrams of a circuit for generating the control signals according to FIGS. 2 to 6.

FIG. 8 illustrates a block diagram of a circuit SG which generates an output signal as a function of two input signals. In this case, the output signal "output clock" assumes a course as illustrated in FIGS. 2 to 4. In addition to the terminal for the output signal "output clock", the circuit SG also has two terminals for two input signals "clock" and "data valid", which each have active and inactive states and whose courses or profiles are likewise illustrated in FIGS. 2 to 4. In this case, as in the following explanations as well, active means the state "log 1" and inactive means the state "log. 0". The terminal for the second input signal "data valid" of the circuit SG is connected to a first input S1 of a first storage device SRFF1. For its part, the first storage device SRFF1 has a terminal for an output signal Q1 which assumes active and inactive states. The first storage device SRFF1 is configured in such a way that the output signal Q1 of the first storage device SRFF1 has an active state as soon as an active signal is present at the first input S1 of the first storage device SRFF1.

Figure 9:
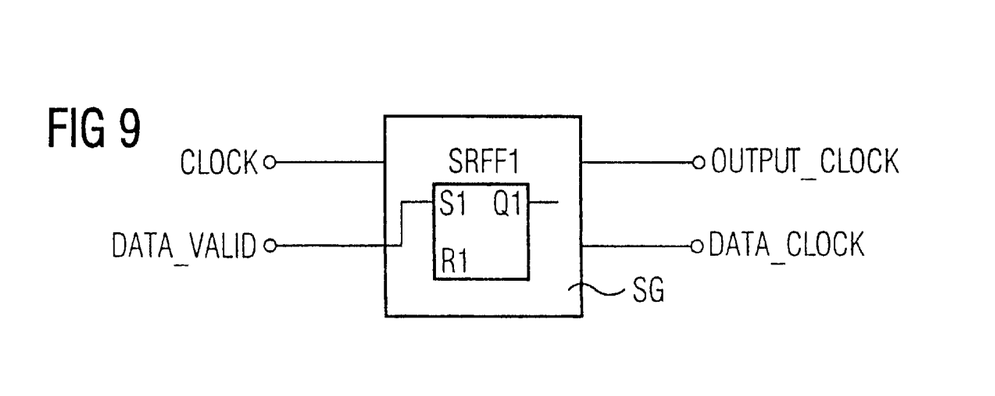

FIG. 9 illustrates a block diagram of a circuit SG which generates a further output signal. The circuit is otherwise unchanged in comparison with the circuit SG according to FIG. 8. The further output signal "data clock" in this case assumes a profile as illustrated in FIGS. 5 and 6.

FIGS. 10 to 14 show exemplary circuits for realizing the block diagrams of FIGS. 8 and 9.

Figure 10:
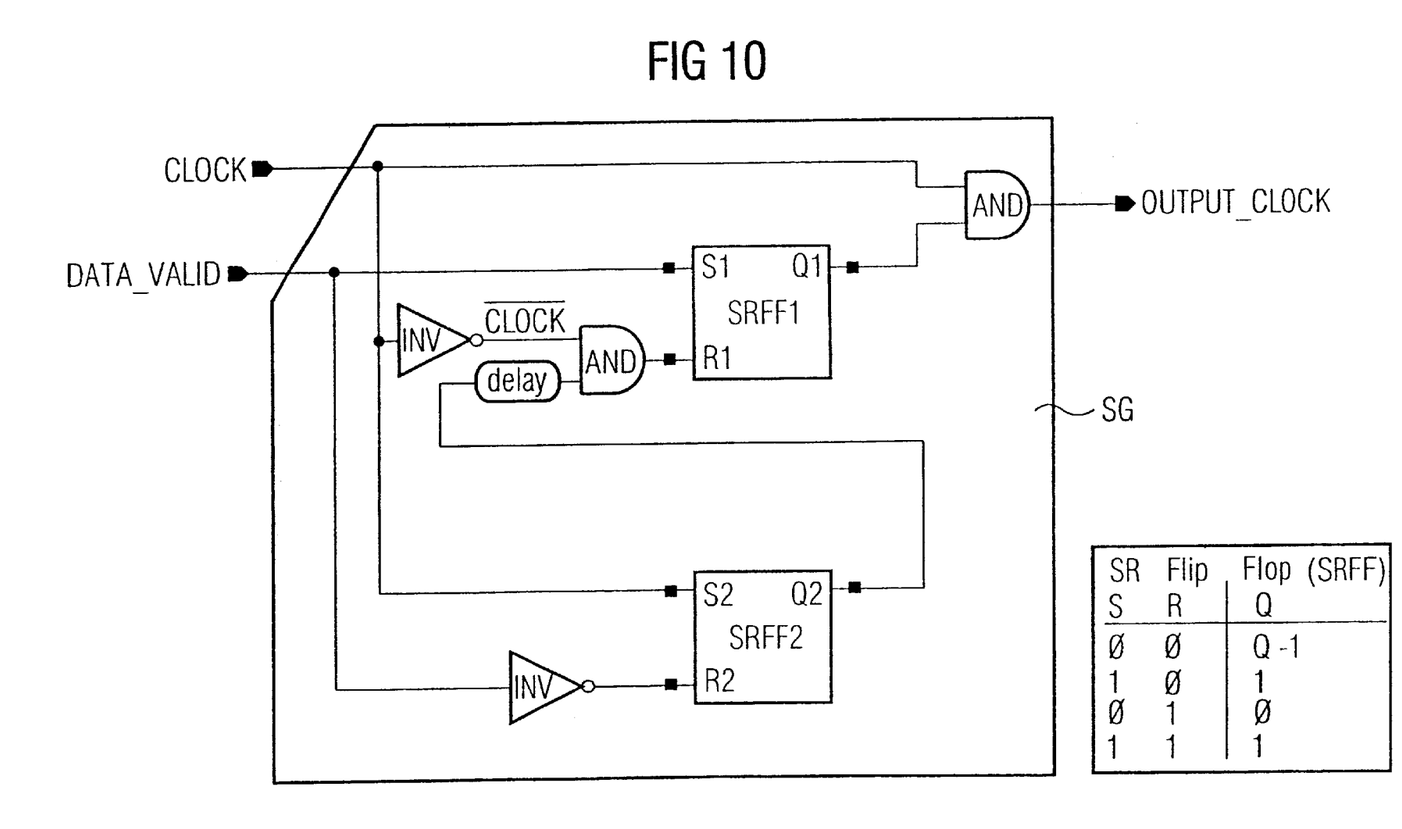
FIGS. 10 to 14 are schematic circuit diagrams of the block diagrams according to FIGS. 8 and 9.

Based on the structure of the block diagram according to FIG. 8, FIG. 10 shows a circuit for generating an output signal "output clock" having a signal profile according to FIG. 2. The circuit SG has a second storage device SRFF2, whose first input S2 is connected to the first input signal "clock" of the circuit SG and whose second input R2 is connected to the second input signal "data valid" of the circuit SG via an inverter. For its part, the second storage device SRFF2 has a terminal for an output signal Q2 which assumes active and inactive states. The output signal Q2 of the second storage device SRFF2 is subjected to a time delay and logic AND combination with the inverted first input signal "clock" of the circuit SG before being connected to a second terminal R1 of the first storage device SRFF1. The output signal Q1 of the first storage device SRFF1 is subjected to a logic AND combination with the first input signal "clock" of the circuit SG, from which the output signal "output clock" of the circuit SG is produced.

Figure 11:
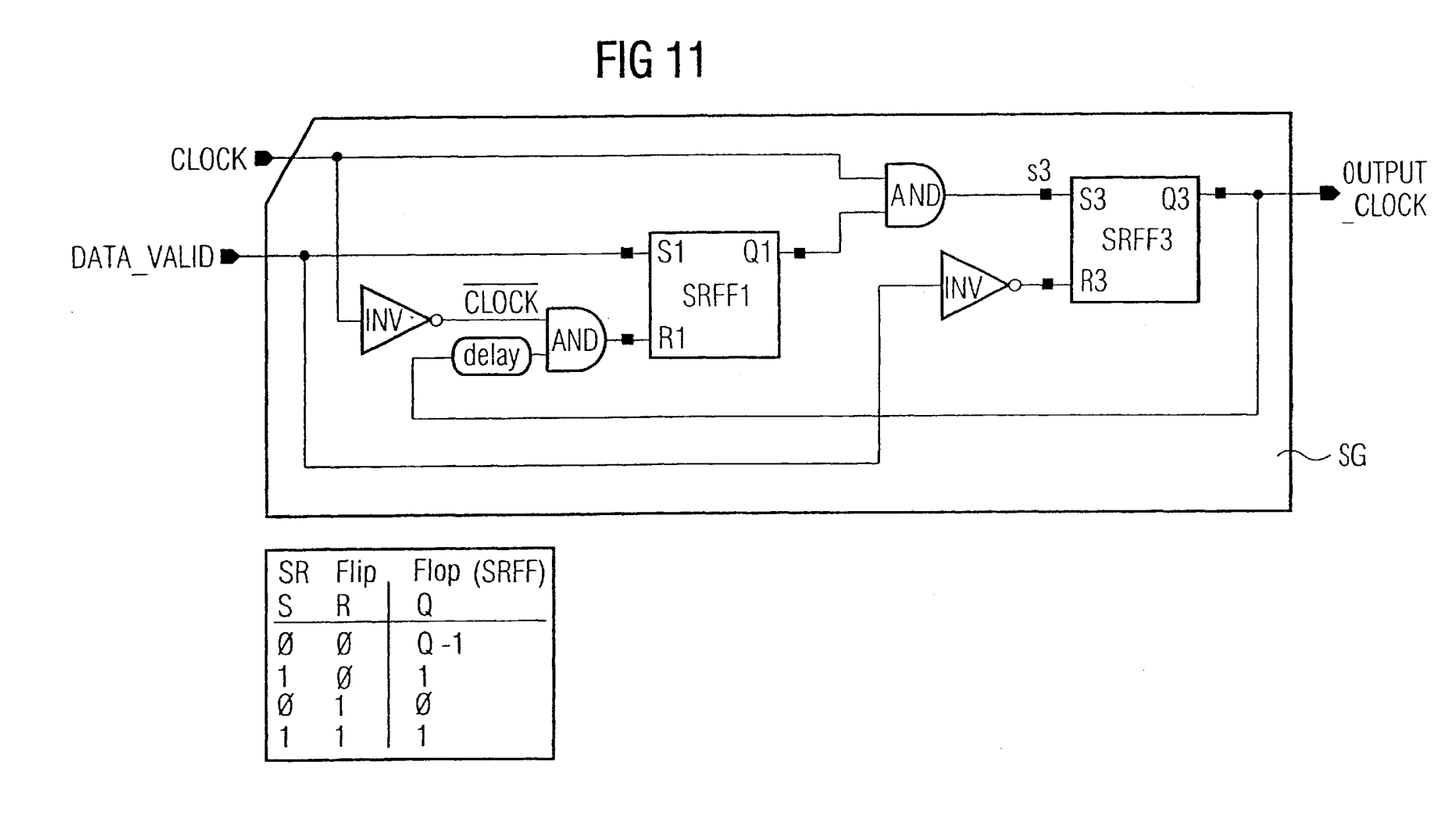

Based on the structure of the block diagram shown in FIG. 8, FIG. 11 shows a circuit for generating an output signal "output clock" having a signal profile according to FIG. 3. The circuit SG has a third storage device SRFF3, whose first input S3 is connected to a signal s3 which is generated with a logic AND combination of the first input signal "clock" of the circuit SG and of the output signal Q1 of the first storage device SRFF1, and whose second input R3 is connected to the second input signal "data valid" of the circuit SG via an inverter. For its part, the third storage device SRFF3 has a terminal for an output signal Q3 which assumes active and inactive states and forms the output signal "output clock" of the circuit SG. The output signal Q3 of the third storage device SRFF3 is subjected to a time delay and a logic AND combination with the inverted first input signal "clock" of the circuit SG before being connected to a second input R1 of the first storage device SRFF1.

Figure 12:
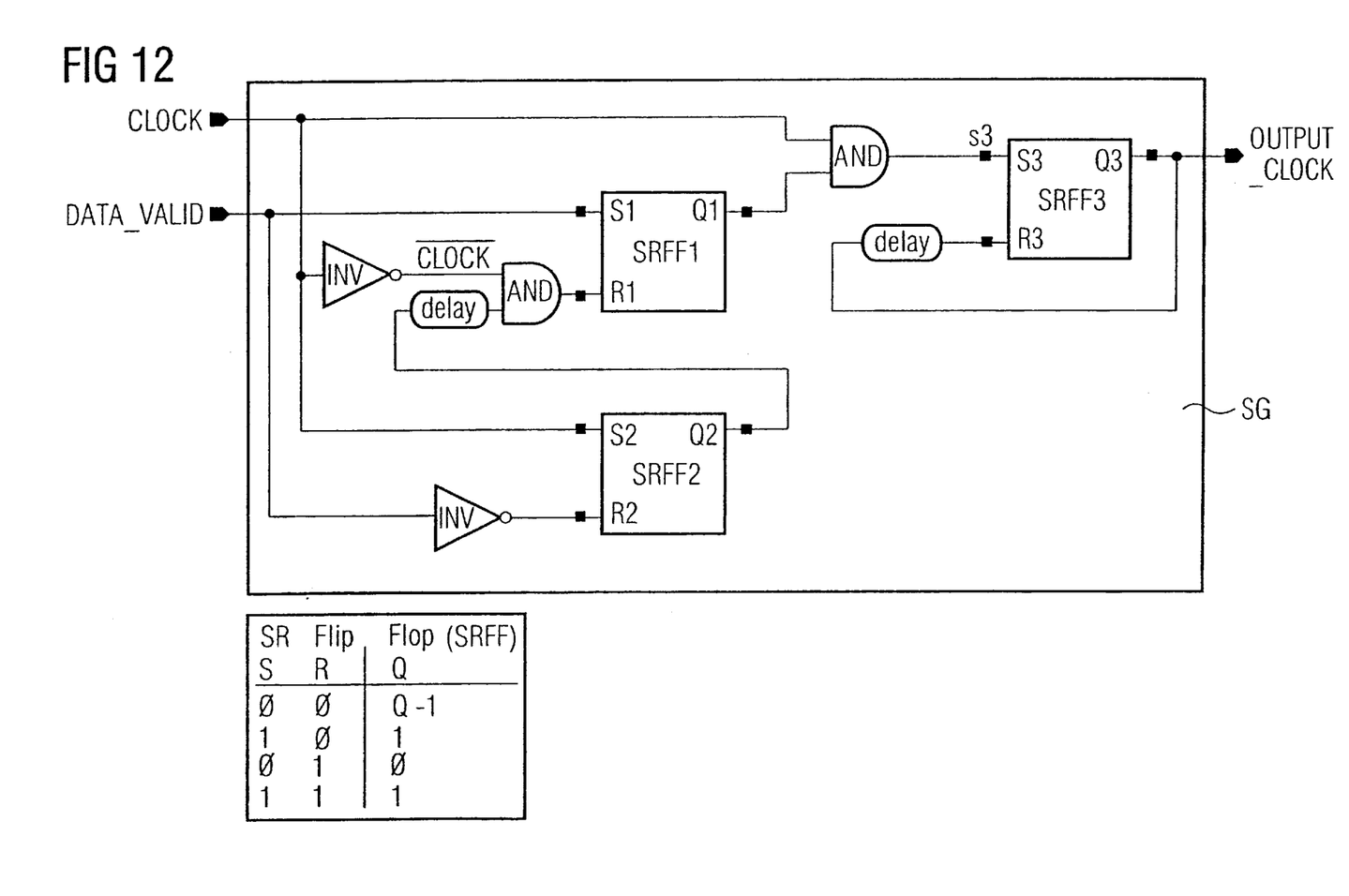

Based on the structure of the block diagram of FIG. 8, FIG. 12 shows a circuit for generating an output signal "output clock" having a signal profile according to FIG. 4. The circuit SG has a second storage device SRFF2, whose first input S2 is connected to the first input signal "clock" of the circuit SG and whose second input R2 is connected to the second input signal "data valid" of the circuit SG via an inverter. For its part, the second storage device SRFF2 has a terminal for an output signal Q2 which assumes active and inactive states. The output signal Q2 of the second storage device SRFF2 is subjected to a time delay and logic AND combination with the inverted first input signal "clock" of the circuit SG before being connected to a second terminal R1 of the first storage device SRFF1. The output signal Q1 of the first storage device SRFF1 is subjected to a logic AND combination with the first input signal "clock" of the circuit SG. The circuit SG has a third storage device SRFF3, whose first input S3 is connected to a signal s3 produced by the logic combination of the first input signal "clock" of the circuit SG and of the output signal Q1 of the first storage device SRFF1. For its part, the third storage device SRFF3 has a terminal for an output signal Q3 which assumes active and inactive states and forms the output signal "output clock" of the circuit SG. The output signal Q3 of the third storage device SRFF3 is subjected to a time delay before being connected to a second input R3 of the third storage device SRFF3.

Figure 13:
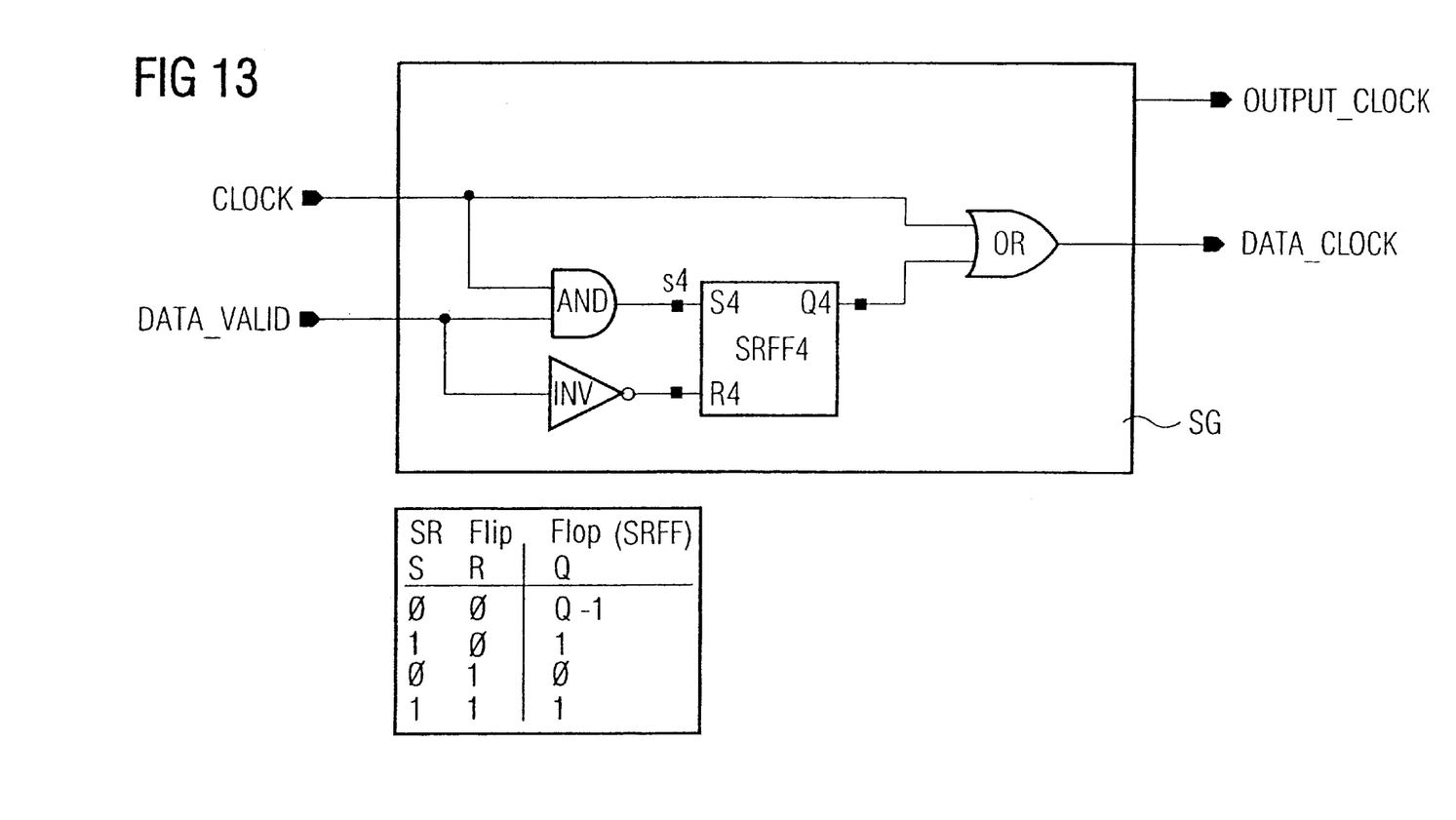

FIG. 13, based on the structure of the block diagram of FIG. 9, shows a circuit for generating a further output signal "data clock" having a signal profile according to FIG. 5. The circuit SG has a fourth storage device SRFF4, whose first input S4 is connected to a signal s4 produced by a logic AND combination of the first input signal "clock" of the circuit SG and of the second input signal "data valid" of the circuit SG, and whose second input R4 is connected to the second input signal "data valid" of the circuit SG via an inverter. For its part, the fourth storage device SRFF4 has a terminal for an output signal Q4 which assumes active and inactive states. The further output signal "data clock" of the circuit SG is produced by a logic OR combination of the first input signal "clock" of the circuit SG with the output signal Q4 of the fourth storage device SRFF4.

Figure 14:
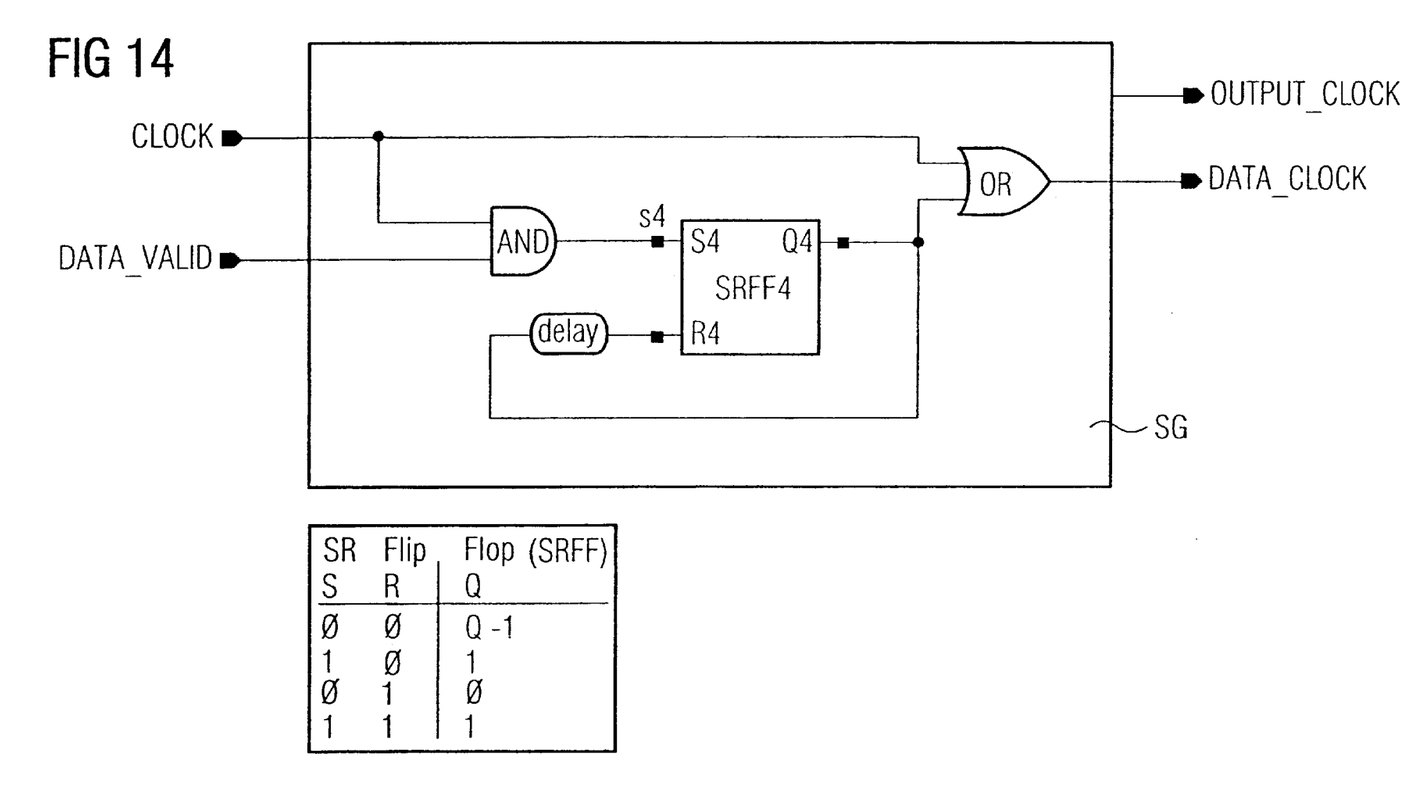

Based on the structure of the block diagram according to FIG. 9, FIG. 14 shows a circuit for generating a further output signal "data clock" having a signal profile according to FIG. 6. The circuit SG has a fourth storage device SRFF4, whose first input S4 is connected to a signal s4 generated with a logic AND combination of the first input signal "clock" of the circuit SG and of the second input signal "data valid" of the circuit SG. For its part, the fourth storage device SRFF4 has a terminal for an output signal Q4 which assumes active and inactive states. A second input R4 of the fourth storage device SRFF4 is connected to the time-delayed output signal Q4 of the fourth storage device SRFF4. The further output signal "data clock" of the circuit SG is produced by a logic OR combination of the first input signal "clock" of the circuit SG with the output signal Q4 of the fourth storage device SRFF4.

In all of the circuits shown in FIGS. 8 to 14, bistable RS multivibrators (RS flip-flops) are used as the storage devices.

I claim:

1. A circuit for generating output signals as a function of input signals, comprising:

a first terminal for receiving a first input signal and a second terminal for receiving a second input signal, each of said first and second input signals having an active state and an inactive state;

a first output, connected to said first terminal, for supplying a first output signal having an active state and an inactive state and being derived from the first and second input signals;

a second output, connected to said first terminal, for supplying a second output signal having an active state and an inactive state;

a storage device having an input connected to said second terminal for receiving the second input signal and having an output, connected to said first output, for supplying an output signal having an active state and an inactive state, said storage device being configured such that the output signal of said output of said storage device has an active state as soon as an active signal is present at said input of said storage device, such that, in the event of the output signal of the storage device being in the active state, the first output signal is switched from the inactive state to the active state at a first instant in the event of a last occurring transition selected from the group consisting of a transition of the first input signal from the inactive state to the active state and a transition of the second input signal from the inactive state to the active state, when the first input signal is in the active state, and such that the second output signal is switched from the inactive state to the active state at a second instant in the event of a transition of the first input signal from the inactive state to the active state.

2. The circuit according to claim 1, wherein said storage device is configured such that the first output signal is switched from the active state to the inactive state in the event of a transition of the first input signal from the active state to the inactive state immediately following the first instant.

3. The circuit according to claim 2, wherein said storage device is a first storage device, said input of said first storage device is a first input and said first storage device has a second input, and including:

a second storage device having a first input connected to said first terminal for receiving the first input signal, and having a second input and an output;

a first inverter having an input connected to said second terminal for receiving the second input signal and having an output connected to said second input of said second storage device;

a delay circuit having an input connected to said output of said second storage device and having an output;

a second inverter having an input connected to said first terminal for receiving the first input signal and having an output;

a first logic combination circuit having a first input connected to said output of said second inverter, a second input connected to said output of said delay circuit, and an output connected to said second input of said first storage device; and a second logic combination circuit having a first input connected to said first terminal for receiving the first input signal, a second input connected to said output of said first storage device, and an output connected to said first output for providing the first output signal.

4. The circuit according to claim 1, wherein said storage device is configured such that the first output signal is switched from the active state to the inactive state in the event of a last occurring transition selected from the group consisting of a transition of the first input signal from the active state to the inactive state immediately following the first instant and a transition of the second input signal from the active state to the inactive state.

5. The circuit according to claim 4, wherein said storage device is a first storage device, said input of said first storage device is a first input and said first storage device has a second input, and including:

a first logic combination circuit having a first input connected to said first terminal for receiving the first input signal, a second input connected to said output of said first storage device and having an output;

a first inverter having an input connected to said second terminal for receiving the second input signal and having an output;

a second storage device having a first input connected to said output of said first logic combination circuit, having a second input connected to said output of said first inverter, and having an output connected to said first output for supplying the first output signal;

a second inverter having an input connected to said first input terminal for receiving the first input signal and having an output;

a second logic combination circuit having a first input connected to said output of said second inverter, having a second input, and an output connected to said second input of said first storage device; and a delay circuit having an input connected to said output of said second storage device and an output connected to said second input of said second logic combination circuit for receiving the first output signal from said second storage device and for supplying the first output signal time delayed to said second combination circuit, said second logic combination circuit logically combining the time delayed first output signal with an inverted first input signal.

6. The circuit according to claim 1, wherein said storage device is configured such that the first output signal remains in the active state during a fixed time period and subsequently changes to the inactive state.

7. The circuit according to claim 6, wherein said storage device is configured such that the fixed time period is at least as long as is required by components, to be connected to said first output, for a reliable identification of a transition of the first output signal between the active state and the inactive state.

8. The circuit according to claim 6, wherein said storage device is a first storage device, said input of said first storage device is a first input and said first storage device has a second input, and including:

a first inverter having an input connected to said second terminal for receiving the second input signal and having an output;

a second inverter having an input connected to said first terminal for receiving the first input signal and having an output;

a first logic combination circuit having a first input connected to said output of said second inverter for receiving an inverted first input signal, having a second input, and an output connected to said second input of said first storage device;

a second storage device having a first input connected to said first terminal for receiving the first input signal, a second input connected to said output of said first inverter for receiving an inverted second input signal, and having an output having an active state and an inactive state;

a first delay circuit having an input connected to said output of said second storage device and having an output;

a second logic combination circuit having a first input connected to said first terminal for receiving the first input signal, a second input connected to said output of said first storage device, and having an output;

a third storage device having a first input connected to said output of said second logic combination circuit, a second input, and having an output connected to said first output for supplying the first output signal; and a second delay circuit having an input connected to said output of said third storage device and having an output connected to said second input of said third storage device for supplying the first output signal time delayed to said third storage device.

9. The circuit according to claim 1, wherein said storage device is configured such that the second output signal is switched from the active state to the inactive state in the event of a last occurring transition selected from the group consisting of a transition of the first input signal from the active to the inactive state immediately following the second instant and a transition of the second input signal from the active state to the inactive state.

10. The circuit according to claim 9, wherein said storage device is a first storage device, said input of said first storage device is a first input and said first storage device has a second input, and including:

a first logic combination circuit having a first input connected to said first terminal for receiving the first input signal, a second input connected to said second terminal for receiving the second input signal, and having an output;

an inverter having an input connected to said second terminal for receiving the second input signal and having an output;

a second storage device having a first input connected to said output of said first logic combination circuit, a second input connected to said output of said inverter for receiving an inverted second input signal, and having an output having an active state and an inactive state; and a second logic combination circuit having a first input connected to said first terminal for receiving the first input signal, a second input connected to said output of said second storage device, and having an output connected to said second output for supplying the second output signal.

11. The circuit according to claim 1, wherein said storage device is configured such that the second output signal remains in the active state during a fixed time period and subsequently changes to the inactive state.

12. The circuit according to claim 11, wherein said storage device is configured such the fixed time period, calculated from an instant starting when the second input signal changes to the active state, is at least as long as is required by components, to be connected to the second output, for a reliable identification of a transition of the second output signal between the active state and the inactive state.

13. The circuit according to claim 7, wherein said storage device is a first storage device, said input of said first storage device is a first input and said first storage device has a second input, and including:

a first logic combination circuit having a first input connected to said first terminal for receiving the first input signal, a second input connected to said second terminal for receiving the second input signal, and having an output;

a second logic combination circuit having a first input connected to said first terminal for receiving the first input signal, a second input, and an output connected to said second output for supplying the second output signal;

a second storage device having a first input connected to said output of said first logic combination circuit, a second input, and having an output having an active state and an inactive state connected to said second input of said second logic combination circuit; and a delay circuit having an input connected to said output of said second storage device and having an output connected to said second input of said second storage device.

* * * * *